(12) United States Patent
Im et al.

(10) Patent No.: US 9,083,001 B2
(45) Date of Patent: Jul. 14, 2015

(54) ORGANIC LIGHT-EMITTING DIODE AND METHOD FOR PREPARING THE SAME

(75) Inventors: Ja-Hyun Im, Yongin (KR); Kwan-Hee Lee, Yongin (KR); Bum-Suk Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 335 days.

(21) Appl. No.: 13/033,844

(22) Filed: Feb. 24, 2011

(65) Prior Publication Data
US 2011/0204347 A1 Aug. 25, 2011

(30) Foreign Application Priority Data
Feb. 25, 2010 (KR) .................. 10-2010-0017193

(51) Int. Cl.
| | | |
|---|---|---|
| H01L 51/50 | (2006.01) | |
| H01L 51/40 | (2006.01) | |
| H01L 51/52 | (2006.01) | |
| H01L 51/00 | (2006.01) | |
| H01L 27/32 | (2006.01) | |

(52) U.S. Cl.
CPC .......... *H01L 51/5268* (2013.01); *H01L 51/001* (2013.01); *H01L 27/3211* (2013.01); *H01L 51/0059* (2013.01); *H01L 51/0085* (2013.01); *H01L 51/5265* (2013.01)

(58) Field of Classification Search
None
See application file for complete search history.

(56) References Cited

U.S. PATENT DOCUMENTS

| | | |
|---|---|---|
| 2005/0194896 A1 | 9/2005 | Sugita et al. |
| 2006/0049745 A1 | 3/2006 | Handa et al. |
| 2006/0113907 A1 | 6/2006 | Im et al. |
| 2007/0114523 A1* | 5/2007 | Oumi et al. ............ 257/40 |
| 2007/0126353 A1 | 6/2007 | Kubota et al. |
| 2008/0018231 A1 | 1/2008 | Hirakata |
| 2008/0254306 A1 | 10/2008 | Kim et al. |
| 2008/0254703 A1 | 10/2008 | Kim et al. |
| 2009/0230841 A1 | 9/2009 | Boerner |
| 2010/0001301 A1* | 1/2010 | Karg et al. ............ 257/98 |

FOREIGN PATENT DOCUMENTS

| | | | |
|---|---|---|---|
| KR | 10-2002-0063399 A | 8/2002 | |
| KR | 10-2005-0111348 | 11/2005 | |
| KR | 10-2006-0043366 | 5/2006 | |
| KR | 10-2006-0059068 | 6/2006 | |
| KR | 10-2007-0049182 | 5/2007 | |
| KR | 10-2007-0089845 | 9/2007 | |
| KR | 10-2007-0090749 | 9/2007 | |
| KR | 10-0822217 B1 | 4/2008 | |
| KR | 10-0829760 B1 | 5/2008 | |
| KR | 10-0843551 | 7/2008 | |
| KR | 10-2009-0105316 A | 10/2009 | |
| WO | WO 2006/054137 A1 * | 5/2006 | .......... H01L 51/52 |

OTHER PUBLICATIONS

KIPO Registration Determination Certification dated Oct. 31, 2011, for KR patent application No. 10-2010-0017193, 5 pages.

\* cited by examiner

*Primary Examiner* — J. L. Yang
(74) *Attorney, Agent, or Firm* — Christie, Parker & Hale, LLP (57) ABSTRACT

An organic light-emitting diode including a film having a thermal evaporation material and metal particles between a first electrode and a substrate and/or on a second electrode.

18 Claims, 4 Drawing Sheets

ORGANIC LIGHT-EMITTING DIODE AND METHOD FOR PREPARING THE SAME

CROSS-REFERENCE TO RELATED APPLICATION

This application claims the benefit of Korean Patent Application No. 10-2010-0017193, filed on Feb. 25, 2010, in the Korean Intellectual Property Office, the disclosure of which is incorporated herein by reference.

BACKGROUND

1. Field

Aspects of the present invention relate to an organic light-emitting diode.

2. Description of the Related Art

Organic light-emitting diodes (OLEDs), which are self-emitting devices, have wide viewing angles, excellent contrast, quick response times, high brightness, excellent driving voltage characteristics, and high response rates, and can also realize full color images. Conventional OLEDs may include an anode formed on a substrate, and a hole transport layer (HTL), a emissive layer (EML), an electron transport layer (ETL), and a cathode sequentially, formed on the anode. The HTL, the EML, and the ETL are organic thin films including organic compounds.

When a voltage is applied between the anode and the cathode, holes injected from the anode move to the light-emitting layer, via the hole transport layer, and electrons injected from the cathode move to the emissive layer, via the electron transport layer. The electrons and holes recombine in the light-emitting layer to generate excitons. Light is emitted when the excitons transit to a ground state from an excited state.

The luminescent efficiency of an OLED may be categorized into an internal luminescent efficiency and an external luminescent efficiency. The internal luminescent efficiency is influenced by how efficiently excitons are generated and converted into light, in the organic layers, such as the HTL, the EML, and the ETL. On the other hand, the external luminescent efficiency (also referred to as "light coupling efficiency") is influenced by how efficiently light generated in the organic layers is extracted from of the OLED. The total luminescent efficiency of an OLED is reduced, if the external luminescent efficiency is low, even if the internal luminescent efficiency is high. High-quality OLEDs should have a wide viewing angle as well as a high light coupling efficiency.

SUMMARY

Aspects of the present invention provide an organic light-emitting diode (OLED) having a wide viewing angle and improved luminescent efficiency.

According to an aspect of the present invention, there is provided an OLED including: a substrate; a first electrode disposed on the substrate; an organic layer disposed on the first electrode; a second electrode disposed on the organic layer; a first film disposed on a surface of the first electrode that faces away from the organic layer, and a second film disposed on a surface of the second electrode that faces away from the organic layer. The first film includes a first thermal evaporation material and first metal particles. The second film includes a second thermal evaporation material and second metal particles.

Each of the first and second thermal evaporation materials may sublimate at a temperature ranging from about 100° C. to about 500° C., under a pressure of about $10^{-10}$ torr to about $10^{-3}$ torr.

The first and second thermal evaporation materials may be each independently at least one selected from the group consisting of tris-8-quinolinolatoaluminum ($Alq_3$) and a compound represented by following Formula 1, <Formula 1> where, $R_1$ to $R_{12}$ are each independently selected from the group consisting of a hydrogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_3$-$C_{30}$ heteroaryl group, and a group represented by —$N(A_1)(A_2)$, wherein the $A_1$ and $A_2$ are each independently a substituted or unsubstituted $C_6$-$C_{30}$ aryl group, or a substituted or unsubstituted $C_3$-$C_{30}$ heteroaryl group.

According to various embodiments, the average particle diameter of the first and second metal particles may be independently in the range of about 0.1 nm to about 50 nm.

According to various embodiments, the amount of the first metal particles may be in the range of about 1 part to about 50 parts by weight, based on 100 parts by weight of the first film.

According to various embodiments, the amount of the second metal particles may be in the range of about 1 part to about 50 parts by, weight based on 100 parts by weight of the second film.

According to various embodiments, each of the first and second metal particles may comprise particles of at least one metal selected from the group consisting of magnesium (Mg), silver (Ag), aluminum (Al), calcium (Ca), tin (Sn), and indium (In).

According to various embodiments, the first and second films may have thicknesses independently ranging from about 10 nm to about 100 nm.

According to various embodiments, the first electrode may be a transparent electrode or a semi-transparent electrode, and the substrate, the first film, the first electrode, the organic layer, and the second electrode may be sequentially stacked thereon.

According to various embodiments, the second electrode may be a transparent electrode or a semi-transparent electrode, and the substrate, the first electrode, the organic layer, the second electrode, and the second film may be sequentially stacked thereon.

According to various embodiments, the first and second electrodes may each be a transparent electrode or a semi-transparent electrode, and the substrate, the first film, the first electrode, the organic layer, the second electrode and the second film may be sequentially stacked.

According to various embodiments, the first film may directly contact the surface of the first electrode.

According to various embodiments, the second film may directly contact the surface of the second electrode.

According to various embodiments, the organic layer may be patterned according to R, G, and B pixels, and the first and second films may be formed as a common layer, with respect to the R, G, and B pixels.

According to various embodiments, the organic layer may be patterned according to R, G, and B pixels. The first film may include at least one of a first film-R, a first film-G, and a first film-B, and the second film may include at least one of a second film-R, a second film-G, and a second film-B.

According to another aspect of the present invention, there is provided a method of preparing an OLED, including: forming a first electrode on a substrate; forming an organic layer on the first electrode; forming a second electrode on the organic layer, and forming a first film between the first electrode and the substrate, and/or a second film on the second electrode. The first film includes a first thermal evaporation material and first metal particles, and the second film includes a second thermal evaporation material and second metal particles.

According to various embodiments, the forming of the first film may be performed by co-evaporation, using a source of the first thermal evaporation material and a source of the first metal particles.

According to various embodiments, the co-evaporation may be performed at a temperature ranging from about 100° C. to about 500° C., under a pressure ranging from about $10^{-10}$ torr to about $10^{-3}$ torr.

According to various embodiments, the forming of the second film may be performed by co-evaporation, using a source of the second thermal evaporation material and a source of the second metal particles.

According to various embodiments, the co-evaporation may be performed at a temperature ranging from about 100° C. to about 500° C., under a pressure ranging from about $10^{-10}$ torr to about $10^{-3}$ torr.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Reference will now be made in detail to the exemplary embodiments of the present invention, examples of which are illustrated in the accompanying drawings, wherein like reference numerals refer to the like elements throughout. The exemplary embodiments are described below, in order to explain the aspects of present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In addition, when a first element is described as being "connected to" a second element, the first element may be directly connected to the second element, or may be indirectly connected to the second element, via one or more intervening elements.

Figure 1:
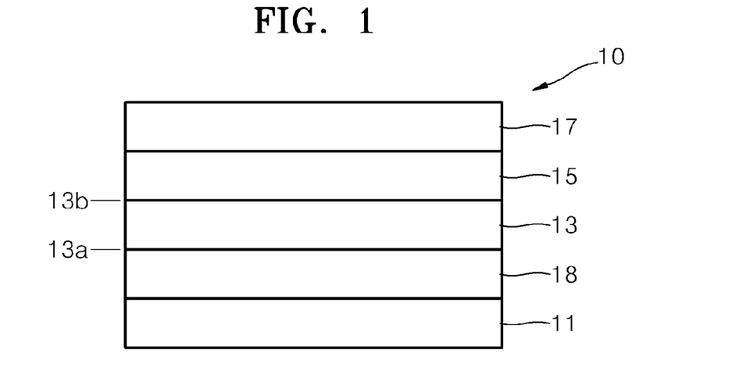
FIG. 1 is a schematic sectional view illustrating a structure of an organic light-emitting diode (OLED), according to an exemplary embodiment of the present invention.

FIG. 1 is a schematic sectional view illustrating the structure of an organic light-emitting diode (OLED) 10, according to an exemplary embodiment of the present invention. The OLED 10 includes a substrate 11, a first film 18, a first electrode 13, a first organic layer 15, and a second electrode 17, which are sequentially stacked. The first electrode 13 may be a transparent or semi-transparent electrode. Light generated in the organic layer 15 passes through the first film 18, via the first electrode 13, and is then extracted out of the OLED 10. The first electrode 13 includes a second surface 13b facing the organic layer 15, and a first surface 13a opposed to the second surface 13b (facing away from the organic layer 15).

The substrate 11 may be any substrate suitable for use in an OLED. For example, the substrate 11 may be a glass substrate or a transparent plastic substrate, having excellent mechanical strength, thermal stability, transparency, surface smoothness, ease of handling, and waterproofness.

The first film 18 is formed on the substrate 11. The first film 18 includes a first thermal evaporation material and first metal particles. The term "thermal evaporation material" refers to a material that forms a film, via a thermal evaporation operation.

The first thermal evaporation material may be a material that sublimates at a temperature range of about 100° C. to about 500° C., under a vacuum pressure of about $10^{-10}$ torr to about $10^{-3}$ torr. Since the first metal particles may also be included in the first film 18 by thermal evaporation, the first film 18 may be formed in a single chamber, by co-evaporation, using a source of the first thermal evaporation material and a source of the first metal particles.

The first thermal evaporation material may have a weight average molecular weight of 1,000 g/mol or less. When the first thermal evaporation material has the above-described weight average molecular weight, the first film 18 may be effectively formed in a chamber, using a thermal evaporation process.

The first thermal evaporation material may have a refractive index of about 1.5 or more, for example, in the range of about 1.5 to about 2.5. Since an OLED generally has a structure in which a plurality of layers formed of various materials are stacked, a portion of the light generated in the organic layer may not be emitted outside of the OLED, due to internal reflection, so that the light may be dissipated within the OLED, when passing through the layers. In an OLED having low external luminescent efficiency, the total luminescent efficiency of the OLED may be reduced, even if conversion efficiency of light is high in the organic layer. However, in the case where the first thermal evaporation material has the above-described refractive index range, the total internal reflection of light that is generated in the organic layer 15 and directed toward the first film 18 may be effectively reduced. Accordingly, the OLED 10 has excellent light coupling efficiency.

The first thermal evaporation material may be, for example, tris-8-quinolinolatoaluminum (Alq$_3$) or a compound represented by following Formula 1, but is not limited thereto.

<Formula 1>

In Formula 1, $R_1$ to $R_{12}$ may be each independently selected from the group consisting of a hydrogen atom, a hydroxyl group, a cyano group, a substituted or unsubstituted $C_1$-$C_{30}$ alkyl group (for example, a substituted or unsubstituted $C_1$-$C_{10}$ alkyl group), a substituted or unsubstituted $C_1$-$C_{30}$ alkoxy group (for example, a substituted or unsubstituted $C_1$-$C_{10}$ alkoxy group), a substituted or unsubstituted $C_2$-$C_{30}$ alkenyl group (for example, a substituted or unsubstituted $C_2$-$C_{10}$ alkenyl group), a substituted or unsubstituted $C_2$-$C_{30}$ alkynyl group (for example, a substituted or unsubstituted $C_2$-$C_{10}$ alkynyl group), a substituted or unsubstituted $C_6$-$C_{30}$ aryl group (for example, a substituted or unsubstituted $C_6$-$C_{20}$ aryl group), a substituted or unsubstituted $C_3$-$C_{30}$ heteroaryl group (for example, a substituted or unsubstituted $C_3$-$C_{20}$ heteroaryl group), and a group represented by —N($A_1$)($A_2$). In this case, the $A_1$ and $A_2$ may be each independently a substituted or unsubstituted $C_6$-$C_{30}$ aryl group (for example, a substituted or unsubstituted $C_6$-$C_{20}$ aryl group), or a substituted or unsubstituted $C_3$-$C_{30}$ heteroaryl group (for example, a substituted or unsubstituted $C_3$-$C_{20}$ heteroaryl group).

In Formula 1, specific examples of the unsubstituted $C_1$-$C_{30}$ alkyl group may be a methyl group, an ethyl group, a propyl group, an isobutyl group, a sec-butyl group, a pentyl group, an iso-amyl group, and a hexyl group, wherein at least one hydrogen atom in the alkyl group may be substituted with a halogen atom, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_1$-$C_{30}$ alkenyl group, a $C_1$-$C_{30}$ alkynyl group, a $C_6$-$C_{30}$ aryl group, a $C_7$-$C_{20}$ arylalkyl group, a $C_2$-$C_{20}$ heteroaryl group, a $C_3$-$C_{30}$ heteroarylalkyl group, a $C_6$-$C_{30}$ aryloxy group, or a group represented by —N($Z_1$)($Z_2$). In this case, the $Z_1$ and $Z_2$ may be each independently a hydrogen atom, a substituted or unsubstituted $C_1$-$C_{30}$ alkyl group, a substituted or unsubstituted $C_6$-$C_{30}$ aryl group, or a substituted or unsubstituted $C_2$-$C_{30}$ heteroaryl group.

In Formula 1, the unsubstituted $C_1$-$C_{30}$ alkoxy group may be a group represented by —OX, wherein X may be the alkyl group described above. Specific examples of the alkoxy group are a methoxy group, an ethoxy group, and an isopropyloxy group. At least one hydrogen atom in the alkoxy group may be substituted with the substituents described with reference to the alkyl group.

In Formula 1, the unsubstituted $C_2$-$C_{30}$ alkenyl group is a hydrocarbon chain having a carbon-carbon double bond in the middle or at one end of the alkyl group described above. Examples of the unsubstituted $C_2$-$C_{30}$ alkenyl group are an ethylene group, a propylene group, a butylene group, and a hexylene group. At least one of the hydrogen atoms in the alkenyl group may be substituted with the substituents described with reference to the alkyl group.

In Formula 1, the unsubstituted $C_2$-$C_{30}$ alkynyl group is a hydrocarbon chain having a carbon-carbon triple bond in the middle or at one end of the alkyl group described above. At least one hydrogen atom in the alkynyl group may be substituted with the substituents described with reference to the alkyl group. Examples of the substituted or unsubstituted $C_2$-$C_{30}$ alkynyl group are an acetylene group, a propylene group, a phenylacetylene group, a naphthylacetylene group, an isopropylacetylene group, a t-butylacetylene group, and a diphenylacetylene group.

In Formula 1, the unsubstituted $C_6$-$C_{30}$ aryl group represents a carbocyclic aromatic system having 6 to 30 carbon atoms, including at least one aromatic ring. The aromatic rings may be fused to each other or bonded to each other via a single bond. At least one hydrogen atom in the aryl group may be substituted with the substituents described with reference to the alkyl group.

In Formula 1, examples of the substituted or unsubstituted $C_6$-$C_{30}$ aryl group may be a phenyl group, a $C_1$-$C_{10}$ alkylphenyl group (e.g., an ethylphenyl group), a halophenyl group (e.g., an o-, m- or p-fluorophenyl group and a dichlorophenyl group), a cyanophenyl group, a dicyanophenyl group, a trifluoromethoxyphenyl group, a biphenyl group, a halobiphenyl group, a cyanobiphenyl group, $C_1$-$C_{10}$ biphenyl group, $C_1$-$C_{10}$ alkoxybiphenyl group, an o-, m- or p-tolyl group, an o-, m- or p-cumenyl group, a mesityl group, a phenoxyphenyl group, a (α, α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), a cyanonaphthyl group, a fluorenyl group, a di($C_1$-$C_{10}$ alkyl) fluorenyl group, an anthracenyl group, an azulenyl group, a heptalenyl group, an acenaphthylenyl group, a phenalenyl group, a fluorenyl group, an anthraquinonyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group.

In Formula 1, the unsubstituted $C_3$-$C_{30}$ heteroaryl group represents at least one aromatic ring system including at least one of the heteroatoms selected from the group consisting of N, O, P, and S, and the residual ring atoms of C. The rings of the ring system may be fused to each other or bonded to each other via a single bond. At least one hydrogen atom in the heteroaryl group may be substituted with the substituents described with reference to the alkyl group.

In Formula 1, examples of the unsubstituted $C_3$-$C_{30}$ heteroaryl group may be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, or the like. These groups may also be substituted with the substituents described with reference to the alkyl group.

For example, in Formula 1, $R_1$ to $R_{12}$ may be each selected from the group consisting of a hydrogen atom, a phenyl group, a (N,N'-dimethyl)aminophenyl group, a biphenyl group, a naphthyl group, an anthracenyl group, a fluorenyl group, a dimethylfluorenyl group, and N-phenylcarbazolyl group, but is not limited thereto. For example, in Formula 1, $R_5$ to $R_{12}$ may be a hydrogen atom, and $R_1$ to $R_4$ may be each independently selected from the group consisting of a phenyl group, (N,N'-diphenyl)aminophenyl group, a naphthyl group, an anthracenyl group, a fluorenyl group, a dimethylfluorenyl group, and N-phenylcarbazolyl group, but are not limited thereto.

The first film 18 includes the first metal particles in addition to the first thermal evaporation material. The first metal particles scatter light passing through the first film 18. In an OLED having a resonance structure that allows light to be extracted out of the OLED, with the light being reflected multiple times between a first electrode and a second electrode, the constructive interference principle produces multiple different interference patterns and reflections, according to each of R, G, and B wavelengths. Therefore, optical path differences for respective R, G, and B colors may vary, according to a viewing angle, thereby causing a change of the wavelength (color) of R, G, and/or B light extracted therefrom. That is, the color coordinates of the R, G, and B light actually observed may differ, according to a viewing angle.

However, in the OLED 10, the first metal particles in the first film 18 produce a light-scattering effect. Accordingly, the first metal particles reduce color purity variations according to changes in a viewing angle. Thus, the OLED 10 has excellent viewing angle characteristics and color purity. Also, the first metal particles may enhance the electrical conductivity of the first film 18, thereby improving internal luminescent efficiency. Furthermore, since the first metal particles improve the refractive index of the first film 18, thereby increasing light-coupling efficiency, the first film 18 may enhance the brightness of the OLED 10.

The average particle diameter of the first metal particles may be in the range of about 0.1 nm to about 50 nm, for example, about 0.3 nm to about 25 nm. Because the average particle diameter of the first metal particles corresponds to about ¼ of the wavelength range of light (for example, visible light) generated by the OLED 10, light scattering may be effectively induced.

The amount of the first metal particles may be in the range of about 1 part to about 50 parts by weight, for example, about 10 parts to about 20 parts by weight, based on 100 parts by weight of the first film 18. If the amount of the first metal particles is within the range described above, the first film 18 may exhibit appropriate light scattering, an improved refractive index, and excellent electrical conductivity.

For example, the first metal particles may be particles of at least one metal selected from the group consisting of magnesium (Mg), silver (Ag), aluminum (Al), calcium (Ca), tin (Sn) and indium (In), but is not limited thereto. The thickness of the first film 18 may be in the range of about 10 nm to about 100 nm, for example, about 50 nm to about 70 nm. If the thickness of the first film 18 is within the range described above, the first film 18 may operate as a capping layer that maximizes light coupling efficiency of the OLED 10. The first film 18 may also exhibit light scattering effects that provide for an improved viewing angle.

The first film 18 may improve the light coupling efficiency, by substantially preventing the total internal reflection of light generated in the organic layer 15, passing through a first electrode 13, and proceeding to the first film 18. The first film 18 may improve the internal luminescent efficiency, by supplementing the electrical conductivity of the first electrode 13. Thus, the OLED 10 may have excellent light efficiency.

The first electrode 13 is formed on the first film 18. The first electrode 13 may be formed by depositing or sputtering a material for the first electrode 13, on the substrate 11. If the first electrode 13 is an anode, the material used to form the first electrode 13 may be a high work-function material, so as to facilitate hole injection. The first electrode 13 may be a transparent electrode or a semi-transparent electrode. Transparent and conductive materials, such as indium tin oxide (ITO), indium zinc oxide (IZO), tin oxide ($SnO_2$), and zinc oxide (ZnO), may be used to form the first electrode 13. The first electrode 13 may be formed as a semi-transparent electrode using Mg, Al, Al—Li, Ca, Mg—In, Mg—Ag, or the like.

The organic layer 15 is formed on the first electrode 13. Herein, the term "organic layer" refers to any layer interposed between a first electrode and a second electrode, which includes an organic material. The organic layer is not limited to an organic layer formed of only organic materials. For example, the organic layer may also include a metal complex.

The organic layer 15 may include at least one of a hole injection layer (HIL), a hole transport layer (HTL), an emissive layer (EML), a hole blocking layer (HBL), an electron transport layer (ETL), and an electron injection layer (EIL). The HIL may be formed on the first electrode 13, by vacuum deposition, spin coating, casting, Langmuir-Blodgett (LB) deposition, or the like.

When the HIL is formed using vacuum deposition, the deposition conditions may vary, according to a compound that is used to form the HIL and the desired structure and thermal properties of the HIL. In general, the conditions for vacuum deposition may include a deposition temperature of about 100 to about 500° C., a pressure of about $10^{-8}$ to about $10^{-3}$ torr, and a deposition rate of about 0.01 to about 100 Å/sec.

When the HIL is formed using spin coating, the coating conditions may vary, according to a compound that is used to form the HIL and the desired structure and thermal properties of the HIL. In general, the coating rate may be in the range of about 2,000 rpm to about 5,000 rpm, and a temperature for a heat treatment to remove a solvent after coating may be in the range of about 80° C. to about 200° C.

The HIL may be formed of any material that is commonly used to form an HIL. Examples of the material that can be used to form the HIL are a phthalocyanine compound such as copperphthalocyanine, 4,4',4''-tris (3-methylphenylphenylamino)triphenylamine (m-MTDATA), N,N'-di(1-naphthyl)-N,N'-diphenylbenzidine (NPB), 4,4',4''-tris(N,N-diphenylamino)-triphenylamine (TDATA), 4,4',4''-tris[2-naphthyl(phenyl)amino]triphenylamine (2T-NATA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS), but are not limited thereto.

m-MTDATA

TDATA

2T-NATA

The thickness of the HIL may be in the range of about 100 Å to 10,000 Å, and for example, about 100 Å to about 1,000 Å. If the thickness of the HIL is within the range described above, an excellent hole injecting ability of the HIL may be obtained, without a substantial increase in driving voltage.

An HTL may be formed on the HIL by vacuum deposition, spin coating, casting, LB deposition, or the like. When the HTL is formed by vacuum deposition or spin coating, the conditions for deposition and coating may be similar to those for the formation of the HIL, although the conditions for the deposition and coating may vary, according to a material that is used to form the HTL.

The HTL may be formed of any material that is commonly used to form an HTL. Examples of the material that can be used to form the HTL are a carbazole derivative such as N-phenylcarbazole and polyvinylcarbazole, an amine derivative having an aromatic condensation ring such as N,N'-bis(3-methylphenyl)-N,N'-diphenyl-[1,1-biphenyl]-4,4'-diamine (TPD), and N,N'-di(naphthalene-1-yl)-N,N'-diphenyl benzydine (α-NPD), and a triphenylamine-based material such as 4,4',4"-tris(N-carbazolyl)triphenylamine) (TCTA). Among these materials, TCTA may not only transport holes but also inhibit excitons from being diffused from the EML.

α-NPD

TPD

The thickness of the HTL may be in the range of about 50 Å to 1,000 Å, and for example, 100 Å to 800 Å. If the thickness of the HTL is within the range described above, an excellent hole transporting ability of the HTL may be obtained, without a substantial increase in a driving voltage.

An EML may be formed on the HTL by vacuum deposition, spin coating, casting, LB deposition, or the like. When the EML is formed by vacuum deposition or spin coating, the conditions for deposition and coating may be similar to those for the formation of the HIL, although the conditions for deposition and coating may vary, according to the material that is used to form the EML.

The EML may be formed of a compound, or a combination of a host and a dopant. Examples of known hosts are tris-8-quinolinolatoaluminum ($Alq_3$), 4,4'-N,N'-dicarbazole-biphenyl (CBP), poly(n-vinylcarbazole) (PVK), 9,10-di(naphthalene-2-yl)anthracene (ADN), 4,4',4"-tris(N-carbazolyl)-triphenylamine (TCTA), 1,3,5-tris(N-phenylbenzimidazole-2-yl)benzene (TPBI), 3-tert-butyl-9,10-di-2-naphthylanthracene (TBADN), E3, and distyrylarylene (DSA), but are not limited thereto.

TPBI

TBADN

E3

PVK

ADN

PtOEP

Ir(piq)₃    Btp₂Ir(acac)

Suitable green dopants include Ir(ppy)₃ (ppy=phenylpyridine), Ir(ppy)₂(acac), Ir(mpyp)₃, 10-(2-Benzothiazolyl)-1,1,7,7-tetramethyl-2,3,6,7-tetrahydro-1H, 5H,11H-1)-benzopyrano[6,7-8-i,j]quinolizin-11-one (C545T), or the like, but are not limited thereto.

Ir(ppy)₃

Ir(ppy)₂(acac)    Ir(mpyp)₃

Suitable red dopants include platinum(II) octaethylporphyrin (PtOEP), Ir(piq)₃, Btp₂Ir(acac), 4-(dicyanomethylene)-2-methyl-6-(para-(dimethylamino)styryl)-4H-pyran (DCM), or the like, but are not limited thereto.

Suitable blue dopants include F₂Irpic, (F₂ppy)₂Ir(tmd), Ir(dfppz)₃, ter-fluorene, 4,4'-bis(4-diphenylaminostyryl)biphenyl (DPAVBi), 2,5,8,11-tetra-t-butyl pherylene (TBPe), 4,4'-bis(2,2-diphenylethenyl)biphenyl (DPAVBi) or the like, but are not limited thereto.

If the dopant and the host are used together, the amount of the dopant may be generally in the range of about 0.01 to about 15 parts by weight, based on 100 parts by weight of the host, but is not limited thereto.

The EML may have a thickness ranging from about 100 Å to 1,000 Å, for example, 200 Å to 600 Å. If the thickness of the EML is within the range described above, an excellent emitting ability of the EML may be obtained, without a substantial increase in a driving voltage.

An HBL may be formed between the HTL and the EML, using vacuum deposition, spin coating, casting, LB deposition, or the like, in order to prevent diffusion of triplet excitons or holes into the ETL, when the EML includes a phosphorescent dopant. When the HBL is formed by vacuum deposition or spin coating, the conditions for deposition and coating may be similar to those for the formation of the HIL, although the conditions for deposition and coating may vary, according to the material that is used to form the HBL. Any material that is commonly used to form an HBL may be used, for example, an oxadiazole derivative, a triazole derivative, or a phenanthroline derivative may be used.

The thickness of the HBL may be in the range of about 50 Å to 1,000 Å, for example, 100 Å to 300 Å. When the thickness of the HBL is within the range described above, an excellent hole blocking ability of the HBL may be obtained, without a substantial increase in a driving voltage.

Thereafter, an ETL may be formed by vacuum deposition, spin coating, casting, or the like. When the ETL is formed by vacuum deposition or spin coating, the deposition and coating conditions may be similar to those for formation of the HIL, although the deposition and coating conditions may vary, according to a compound that is used to form the ETL. A material that is used to form the ETL may be any material that can stably transport electrons injected from the electron injecting electrode (cathode). For example, the material that is used to form the ETL may be a quinoline derivative (e.g., $Alq_3$), TAZ, Balq, or the like, but is not limited thereto.

The thickness of the ETL may be in the range of about 100 Å to 1,000 Å, for example, in the range of 150 Å to 500 Å. When the thickness of the ETL is within the range described above, an excellent electron transporting ability of the ETL may be obtained, without a substantial increase in driving voltage.

An EIL may be formed on the ETL. The EIL may be formed of a material allowing easy injection of electrons from a cathode, but a material for the EIL may not be specifically limited. The material that is used to form the EIL may be LiF, NaCl, CsF, Li$_2$O, BaO, lithium quinolate (Liq), or the like. The deposition and coating conditions are similar to those for formation of the HIL, although the deposition and coating conditions may vary, according to a material that is used to form the EIL.

The thickness of the EIL may be in the range of about 1 Å to 100 Å, for example, in the range of 5 Å to 90 Å. When the thickness of the EIL is within the range described above, an excellent electron injection ability of the EIL may be obtained, without a substantial increase in a driving voltage.

The second electrode 17 is provided on the organic layer 15. The second electrode 17 may be a cathode, which is an electron injecting electrode. A metal that is used to form the second electrode 17 may be a low work-function metal, alloy, an electrically conductive compound, or a combination thereof. In detail, a reflective electrode may be obtained by using Li, Mg, Al, Al—Li, Ca, Mg—In, Mg—Ag, or the like.

The first film 18 may be formed on the first surface 13*a* of the first electrode, that is, between the substrate 11 and the first electrode 13 (see FIG. 1). Although FIG. 1 illustrates that the first film 18 is in contact with the first surface 13*a* of the first electrode 13, additional layers such as a protective layer and/or an interlayer may be interposed between the first film 18 and the first electrode 13.

Although not shown in FIG. 1, various modifications may be possible. For example, a sealing layer (not shown) may be provided on the second electrode 17, so as to seal the OLED 10.

Figure 2:
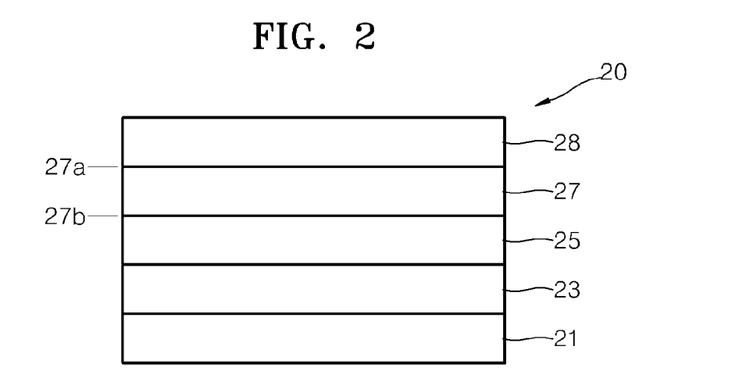
FIG. 2 is a schematic sectional view illustrating a structure of an OLED, according to another exemplary embodiment of the present invention.

FIG. 2 is a schematic sectional view illustrating a structure of an OLED 20, according to another exemplary embodiment of the present invention. The OLED 20 includes a substrate 21, a first electrode 23, an organic layer 25, a second electrode 27, and a second film 28, which are stacked in sequence. The second electrode 27 includes a second surface 27*b* facing the organic layer 15, and a first surface 27*a* opposed to the second surface 27*b*. The second film 28 is formed on the first surface 27*a* of the second electrode 27. The second film 28 includes a second thermal evaporation material and second metal particles. The second electrode 27 may be a transparent or semi-transparent electrode, and light generated in the organic layer 25 passes through the second film 28, via the second electrode 27, and is then extracted from the OLED 20.

The respective layers constituting the OLED 20 are similar to corresponding layers of the OLED 10. Thus, a detailed description thereof will be omitted (refer to the description of the first film 18 for the second film 28, the description of the first thermal evaporation material for the second thermal evaporation material, and the description of the first metal particle for the second metal particle).

The second film 28 can improve light coupling efficiency, by substantially preventing the total internal reflection of light that is generated in the organic layer 25. The second film 28 can also improve the internal luminescent efficiency, by enhancing the electrical conductivity of the second electrode 27. Consequently, the OLED 20 has excellent luminescent efficiency.

Figure 3:
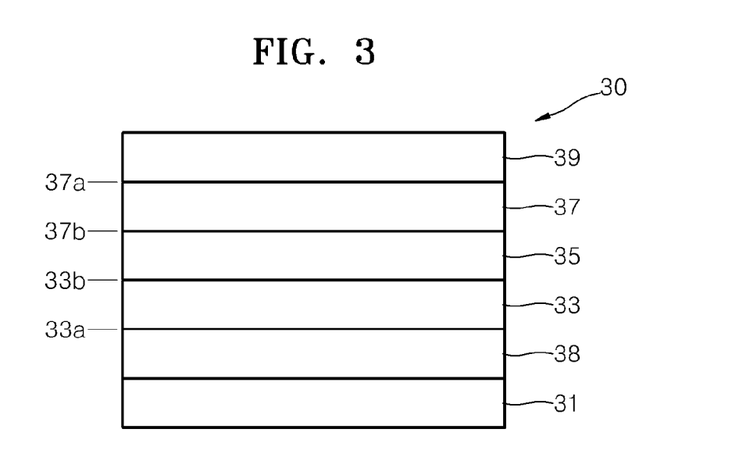
FIG. 3 is a schematic sectional view illustrating a structure of an OLED, according to another exemplary embodiment of the present invention.

FIG. 3 is a schematic sectional view illustrating a structure of an OLED 30 according to another exemplary embodiment of the present invention. The OLED 30 includes a substrate 31, a first film 38, a first electrode 33, an organic layer 35, a second electrode 37, and a second film 39, which are sequentially stacked. The first and second electrodes 31 and 37 in the OLED 30 may be a transparent or semi-transparent electrode, and light generated in the organic layer 35 passes through the first and second films 38 and 39, via the first and second electrodes 31 and 37, and is then extracted out of the OLED 30. Detailed descriptions elements similar to those shown in FIGS. 1 and 2 will not be repeated.

The organic layers, according to the exemplary embodiments of the present invention, may be patterned according to R, G, and B pixels. Thus, the organic layers may include a red emissive organic layer, a green emissive organic layer, and a blue emissive organic layer. As described above, the first films and/or the second films may each be formed as a single layer including the R, G, and B pixels. According to some aspects, the R, G, and B pixels may be referred to as sub-pixels.

The first films may include at least one of a first film-R, a first film-G, and a first film-B, and the second films may include at least one of a second film-R, a second film-G and a second film-B. That is, the first films and/or the second films may be patterned according to R, G, and B pixels or sub-pixels.

The term "first film-R" refers to a region of a first film corresponding to the R pixel. The term "first film layer-G" refers to a region of a first film corresponding to the G pixel. The term "first film layer-B" refers to a region of a first film corresponding to the B pixel. These terms are also identically applied to the second film.

The first film-R, the first film-G, and the first film-B may have the same or different thicknesses. Likewise, the second film-R, the second film-G, and the second film-B may also have the same or different thicknesses.

According to an exemplary embodiment of the present invention, there is provided a method of preparing an OLED, including: forming a first electrode on a substrate; forming an organic layer on the first electrode; forming a second electrode on the organic layer, and forming a first film between the substrate and the first electrode, and/or forming a second film on the second electrode. The first electrode has a second surface facing the organic layer and a first surface opposed to the second surface, and the second electrode has a second surface facing the organic layer and a first surface opposed to the second surface. The first film includes a first thermal evaporation material and first metal particles, and may be formed directly on the first surface of the first electrode. The second film comprises a second thermal evaporation material and second metal particles and may be formed directly on the first surface of the second electrode.

The forming of the first film may be performed in a single chamber by co-evaporation, using a source of the first thermal evaporation material and a source of the first metal particles. The forming of the second film may be performed in a single chamber by co-evaporation, using a source of the second thermal evaporation material and a source of the second metal particles. Although deposition conditions for co-evaporation may vary with a selected material, the co-evaporation may be performed, for example, at a temperature ranging from about 100° C. to about 500° C., under a vacuum pressure ranging about $10^{-10}$ torr to about $10^{-3}$ torr.

Hereinafter, OLEDs according to the exemplary embodiments of the present invention will be described in greater detail, with reference to the following examples. The following examples are for illustrative purposes only and are not intended to limit the scope of the invention.

EXAMPLE 1

A glass substrate including a first electrode (ITO) with 15 $\Omega/cm^2$ (1200 Å) (made by Corning, Inc.) was cut to a size of 50 mm×50 mm×0.5 mm and then ultrasonically cleaned for 5 minutes, in each of isopropyl alcohol and pure water. The resultant underwent thermal treatment for 30 minutes, and N$_2$-plasma treatment. Thereafter, m-MTDATA was vacuum-deposited on the ITO electrode, to thereby form an HIL of 750 Å in thickness. Then α-NPD was vacuum-deposited on the HIL to form an HTL of 800 Å in thickness. A red EML of 300 Å in thickness was formed on the HTL using 98% by weight of $Alq_3$ as a host and 2% by weight of DCM as a dopant. $Alq_3$ was vacuum-deposited on the EML to form an ETL of 300 Å in thickness. LiQ was vacuum-deposited on the ETL to form an EIL with a thickness of 5 Å. Thereafter, Mg:Ag was vacuum-deposited to form a second electrode with a thickness of 120 Å.

Afterwards, $Alq_3$ (refractive index of 1.6 and molecular weight of 462.47), as a thermal evaporation material, and Mg were co-evaporated on the second electrode in a single chamber, at a temperature of 430° C. and a vacuum pressure of $10^{-3}$ torr, to thereby form a film of 60 nm in thickness. The average particle size of Mg particles in the film was 0.3 nm, and the amount of Mg was adjusted, such that the weight of the Mg particles was 20 parts by weight, based on 100 parts by weight of the film.

COMPARATIVE EXAMPLE A

An OLED was prepared in the same manner as in Example 1, except that a film with a thickness of 60 nm was formed by depositing only $Alq_3$ on the second electrode, without using of Mg.

EXAMPLE 2

An OLED was prepared in the same manner as in Example 1, except that a green EML was formed using 99% by weight of $Alq_3$ as a host and 1% by weight of C545T as a dopant.

COMPARATIVE EXAMPLE B

An OLED was prepared in the same manner as in Example 2, except that a film with a thickness of 60 nm was formed by depositing only $Alq_3$ on the second electrode, without using of Mg.

EXAMPLE 3

An OLED was prepared in the same manner as in Example 1, except that a blue EML was formed using 98% by weight of $Alq_3$ as a host and 2% by weight of DPVBI as a dopant.

COMPARATIVE EXAMPLE C

An OLED was prepared in the same manner as in Example 3, except that a film with a thickness of 60 nm was formed by depositing only $Alq_3$ on the second electrode, without using of Mg.

EVALUATION EXAMPLE 1

Figure 4A:
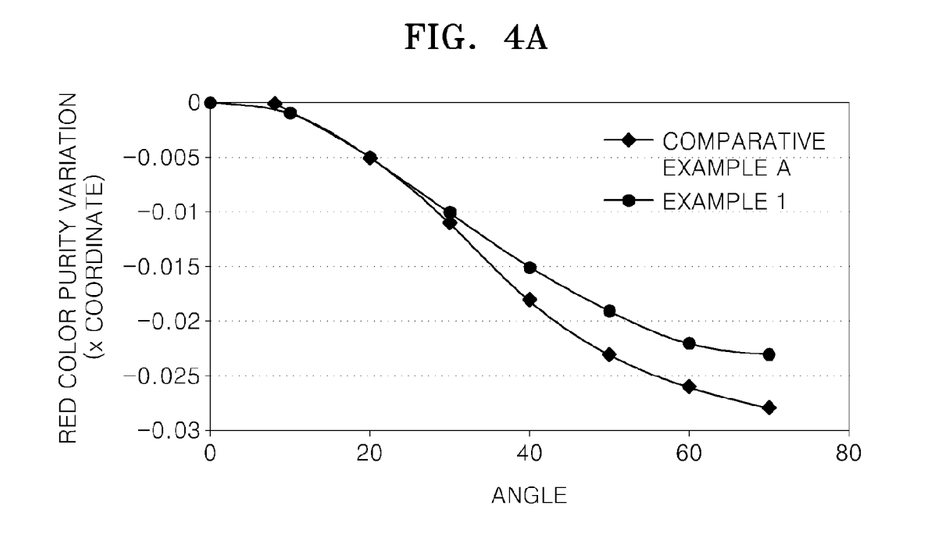
FIGS. 4A and 4B are graphs illustrating color purity variations of X- and Y-coordinates, versus an angle of red light emitted from OLEDs of Example 1 and Comparative Example A.
Figure 4B:
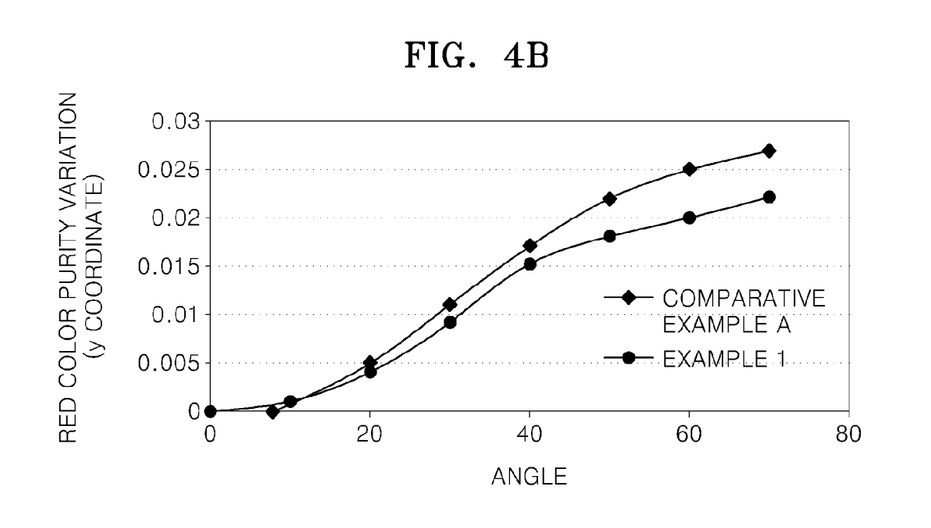
Figure 5A:
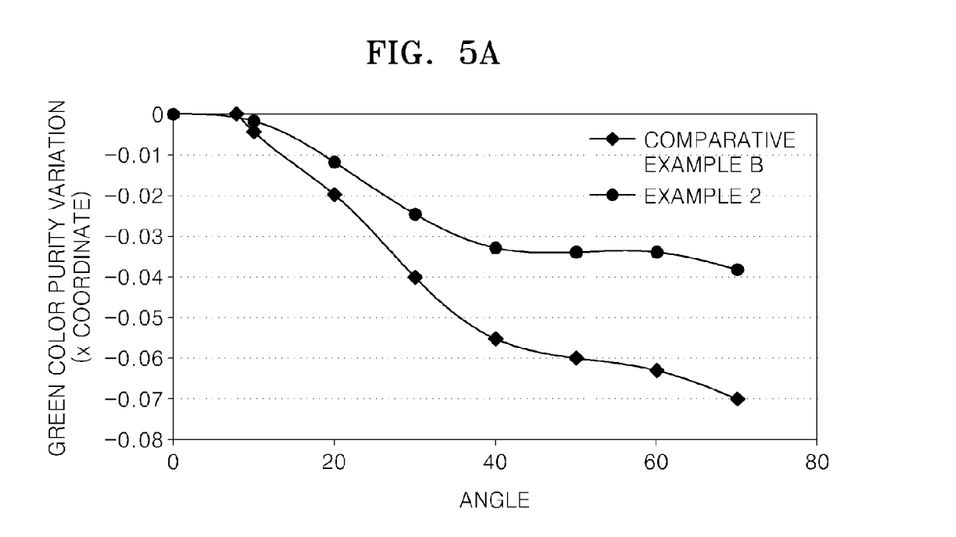
FIGS. 5A and 5B are graphs illustrating color purity variations of X- and Y-coordinates, versus an angle of green light emitted from OLEDs of Example 2 and Comparative Example B.
Figure 5B:
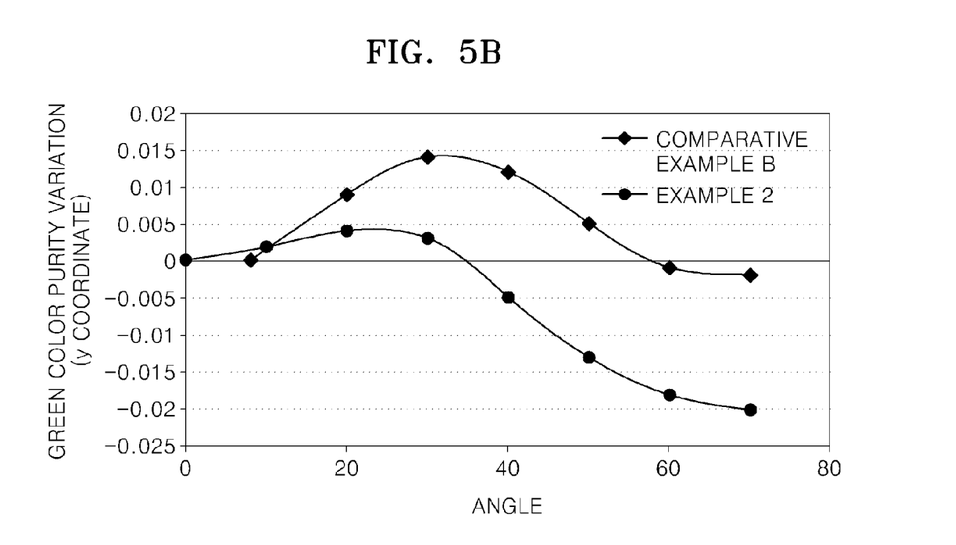
Figure 6A:
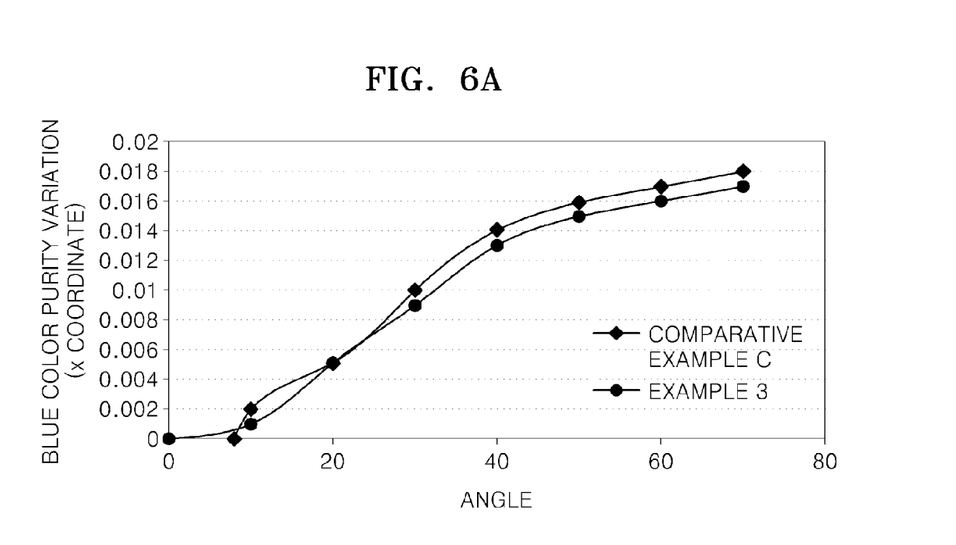
FIGS. 6A and 6B are graphs illustrating color purity variations of X- and Y-coordinates, versus an angle of blue light emitted from OLEDs of Example 3 and Comparative Example C.
Figure 6B:
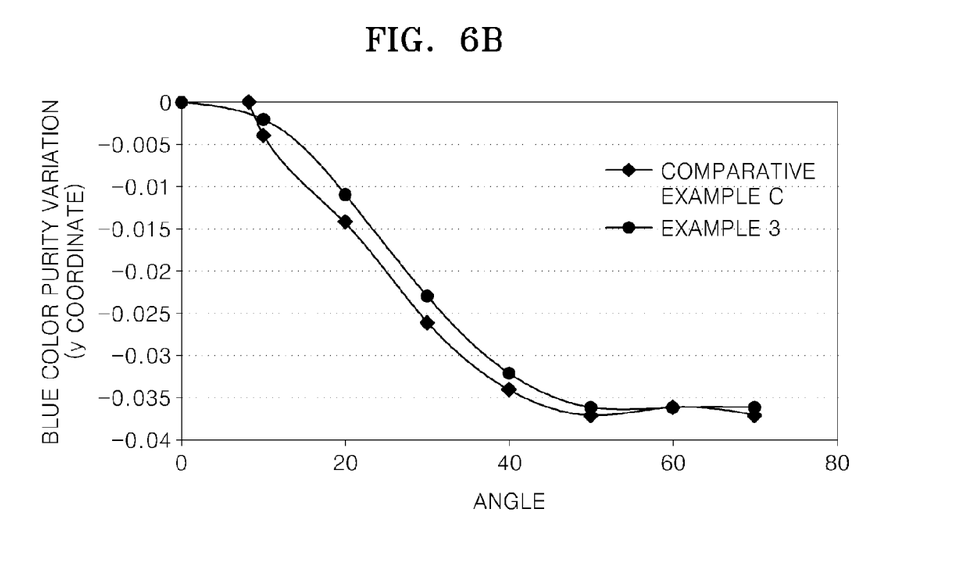

FIGS. 4A and 4B are graphs illustrating color purity variations versus viewing angles of red light emitted from the OLEDs of Example 1 and Comparative Example A, which are plotted on the basis of color purity at 0 degrees (i.e., the color purity variation of red light is 0 at 0 degrees). FIG. 4A represents the X-coordinate of red light and FIG. 4B represents the Y-coordinate of red light. FIGS. 5A and 5B are graphs illustrating color purity variations versus viewing angles of green light emitted from the OLEDs of Example 2 and Comparative Example B, which are plotted on the basis of color purity at 0 degrees (i.e., the color purity variation of green light is 0 at 0 degrees). FIG. 5A represents the X-coordinate of green light and FIG. 5B represents the Y-coordinate of green light. FIGS. 6A and 6B are graphs illustrating color purity variations versus viewing angles of blue light emitted from the OLEDs of Example 3 and Comparative Example C, which are plotted on the basis of color purity at 0 degrees (i.e., the color purity variation of blue light is 0 at 0 degrees). Here, FIG. 6A represents the X-coordinate of blue light and FIG. 6B represents the Y-coordinate of blue light. The color purity was measured using a PR650 (Spectroscan) source measurement unit (made by Photo Research, Inc.) while changing a viewing angle for each OLED.

From FIGS. 4A to 6B, it can be understood that all of red, green, and blue light emitted from the OLEDs of Examples 1, 2, and 3 have less color purity variation at a viewing angle range of 0 to 60 degrees than those of the OLEDs of Comparative Examples A, B, and C. Thus, the OLEDs of Examples 1, 2, and 3 exhibited better viewing angle characteristics than the OLEDs of Comparative Examples A, B, and C.

As set forth herein, according to aspects of the present invention, the OLED can have excellent luminescent efficiency and outstanding color purity characteristic for each of R, G, and B light, irrespective of a viewing angle.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting diode (OLED) comprising:
a substrate;
a first electrode disposed on the substrate;
an organic layer disposed on the first electrode;
a second electrode disposed on the organic layer; and
at least one of a first film and a second film,
wherein:
the first electrode has a second surface facing the organic layer and a first surface opposed to the second surface,
the second electrode has a second surface facing the organic layer and a first surface opposed to the second surface,
the first film comprises a first thermal evaporation material and a first metal particle and is disposed on the first surface of the first electrode,
the second film comprises a second thermal evaporation material and a second metal particle and is disposed on the first surface of the second electrode, and
the first and second thermal evaporation materials are each independently selected from the group consisting of tris-8-quinolinolatoaluminum ($Alq_3$), a compound represented by following Formula 1, and a combination thereof, <Formula 1> wherein, $R_1$ to $R_{12}$ are each independently selected from the group consisting of a hydrogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_3$-$C_{30}$ heteroaryl group, and a group represented by —N($A_1$)($A_2$), wherein the $A_1$ and $A_2$ are each independently a substituted or unsubstituted $C_6$-$C_{30}$ aryl group, or a substituted or unsubstituted $C_3$-$C_{30}$ heteroaryl group, and wherein each of the first and second metal particles comprises particles of at least one metal selected from the group consisting of magnesium (Mg), aluminum (Al), calcium (Ca), tin (Sn), indium (In), and a combination thereof.

2. The OLED of claim 1, wherein each of the first and second thermal evaporation materials sublimates at a temperature ranging from 100° C. to 500° C., under a pressure of $10^{-10}$ torr to $10^{-3}$ torr.

3. The OLED of claim 1, wherein the average diameters of the first and second metal particles are each independently in the range of 0.1 nm to 50 nm.

4. The OLED of claim 1, wherein the amount of the first metal particles is in the range of 1 part to 50 parts by weight, based on 100 parts by weight of the first film.

5. The OLED of claim 1, wherein the amount of the second metal particle is in the range of 1 part to 50 parts by weight, based on 100 parts by weight of the second film.

6. The OLED of claim 1, wherein the first and second films have thicknesses ranging from 10 nm to 100 nm.

7. The OLED of claim 1, wherein:
the first electrode is a transparent electrode or a semi-transparent electrode; and
the substrate, the first film, the first electrode, the organic layer and the second electrode are stacked, in order.

8. The OLED of claim 1, wherein:
the second electrode is a transparent electrode or a semi-transparent electrode; and
the substrate, the first electrode, the organic layer, the second electrode and the second film are stacked, in order.

9. The OLED of claim 1, wherein:
the first and second electrodes are independently selected from a transparent electrode and a semi-transparent electrode; and
the substrate, the first film, the first electrode, the organic layer, the second electrode and the second film are stacked, in order.

10. The OLED of claim 1, wherein the first film directly contacts a surface of the first electrode that faces away from the organic layer.

11. The OLED of claim 1, wherein the second film directly contacts the surface of the second electrode that faces away from the organic layer.

12. The OLED of claim 1, wherein the organic layer is patterned into red (R), green (G), and blue (B) pixels, and the first and second films are each formed as single layer including the R, G, and B pixels.

13. The OLED of claim 1, wherein the organic layer is patterned according to red (R), green (G), and blue (B) pixels,
the first film comprises at least one of a first film-R, a first film-G, and a first film-B, and
the second film comprising at least one of a second film-R, a second film-G, and a second film-B.

14. A method of preparing an OLED, the method comprising:
forming a first electrode on a substrate;
forming an organic layer on the first electrode;
forming a second electrode on the organic layer; and
forming a first film between the first electrode and the substrate, and/or forming a second film on the second electrode, wherein,
the first film comprises a first thermal evaporation material and first metal particles, and
the second film comprises a second thermal evaporation material and second metal particles,
the first and second thermal evaporation materials are each independently selected from the group consisting of tris-8-quinolinolatoaluminum (Alq$_3$) a compound represented by following Formula 1, and a combination thereof, <Formula 1> wherein, $R_1$ to $R_{12}$ are each independently selected from the group consisting of a hydrogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_3$-$C_{30}$ heteroaryl group, and a group represented by —N($A_1$)($A_2$), wherein the $A_1$ and $A_2$, are each independently a substituted or unsubstituted $C_6$-$C_{30}$ aryl group, or a substituted or unsubstituted $C_3$-$C_{30}$ heteroaryl group, and
wherein each of the first and second metal particles comprises particles of at least one metal selected from the group consisting of magnesium (Mg), aluminum (Al), calcium (Ca), tin (Sn), indium (In), and a combination thereof.

15. The method of claim 14, wherein the forming of the first film is performed by coevaporation, using a source of the first thermal evaporation material and a source of the first metal particle.

16. The method of claim 15, wherein the co-evaporation is performed at a temperature ranging from 100° C. to 500° C., under a pressure ranging $10^{-10}$ torr to $10^{-3}$ torr.

17. The method of claim 14, wherein the forming of the second film is performed by co-evaporation, using a source of the second thermal evaporation material and a source of the second metal particle.

18. The method of claim 17, wherein the co-evaporation is performed at a temperature ranging from 100° C. to 500° C., under a pressure ranging $10^{-10}$ torr to $10^{-3}$ torr.

* * * * *